United States Patent [19]

Iwasa

[11] Patent Number: 5,027,175

[45] Date of Patent: Jun. 25, 1991

[54] INTEGRATED CIRCUIT SEMICONDUCTOR DEVICE HAVING IMPROVED WIRING STRUCTURE

[75] Inventor: Shoichi Iwasa, Tokyo, Japan

[73] Assignee: NEC Corporation, Japan

[21] Appl. No.: 400,098

[22] Filed: Aug. 29, 1989

[30] Foreign Application Priority Data

Aug. 29, 1988 [JP] Japan .................................. 63-214220

[51] Int. Cl.⁵ .................. H01L 29/680; H01L 29/780; H01L 27/020; H01L 27/100
[52] U.S. Cl. ................................ 357/23.5; 357/23.14; 357/41; 357/45
[58] Field of Search ...................... 357/23.5, 23.14, 41, 357/45

[56] References Cited

U.S. PATENT DOCUMENTS

| | | | |
|---|---|---|---|
| 4,667,217 | 5/1987 | Janning | 357/54 |
| 4,807,017 | 2/1989 | Ema et al. | 357/68 |
| 4,892,840 | 1/1990 | Esquivel et al. | 437/52 |

FOREIGN PATENT DOCUMENTS

| | | | |
|---|---|---|---|
| 0078169 | 4/1986 | Japan | 357/23.5 |
| 0300567 | 12/1988 | Japan | 357/23.5 |

OTHER PUBLICATIONS

Esquivel et al., High Density Contactless Self Aligned EPROM Cell Array Technology, IEDM 86, pp. 592-595.

Primary Examiner—Michael C. Wimer
Assistant Examiner—Peter T. Brown

[57] ABSTRACT

An integrated circuit semiconductor device having an improved wiring structure is disclosed. An insulating film and a semiconductor layer are formed in sequence on an upper surface of a semiconductor body, and first and second wiring layers are formed in the semiconductor body and in the semiconductor layer, respectively. A plurality of circuit elements are formed in the semiconductor layer on the insulating film, and each of the elements is connected to the first and second wiring layers. When the elements are memory cells, the first wiring layers may be used as bit lines.

15 Claims, 10 Drawing Sheets

INTEGRATED CIRCUIT SEMICONDUCTOR DEVICE HAVING IMPROVED WIRING STRUCTURE

BACKGROUND OF THE INVENTION

1. Field of the Invention

The present invention relates to an integrated circuit semiconductor device having an improved wiring structure, and more particularly, to a semiconductor memory device such as non volatile semiconductor memory device having floating and control gate electrodes.

2. Description of Related Art

A MOS type semiconductor memory device has heretofore been constructed so that contacts are provided on the memory cell drain diffusion layers to make connections to respective aluminium wirings used as bit lines in order to effect the programming and the reading operation. With the above-mentioned conventional MOS type semiconductor memory device, however, a contact must be formed on the drain of each of the memory cells causing a serious hindrance to a further reduction of the cell area of a unit bit which is the modern tendency toward increasing the capacity of a memory. Moreover, a non volatile semiconductor memory device uses double polycrystalline silicon layers; the lower layer constituting floating gate electrodes and the upper layer constituting word lines including control gate electrodes. Therefore, when an attempt is made to decrease the distance among the word lines in order to decrease the cell areas, the contact sandwiched between the two words lines is tapered very steeply, and becomes apt to be broken down.

Furthermore, when the interlayer insulating film between bit lines and word lines including control gate electrodes and forming the contact openings therein becomes thin due to a variance in the etching at the time of forming the contact openings, the polycrystalline silicon layer forming word lines and the aluminum bit lines are capacitively coupled to each other; i.e., they cannot be independently selected and the data cannot be read out. In extreme cases, a hole is unfavorably formed in the interlayer insulating film causing the word lines and the bit lines to be short-circuited. Furthermore, a drain diffusion layer is required having an area which is large enough to provide a drain contact, which is detrimental to reducing the cell area.

To eliminate these disadvantages, which are caused by the contact structure, a new non volatile semiconductor memory device is proposed by J. Esquivel et al. entitled "HIGH DENSITY CONTACTLESS, SELF ALIGNED EPROM CELL ARRAY TECHNOLOGY" in IEDM 86, pp. 592 to 595. In the new device, the drain diffusion layers are formed in the major surface of the semiconductor substrate and extend in one direction as the bits lines which are in parallel with each other. Also, the source diffusion layers are formed in the major surface of the substrate and extend in the same one direction. A pair of source diffusion layers are thus formed at both sides of one drain diffusion layer. The device is not necessary to provide a drain contact; therefore, the disadvantages mentioned above can be eliminated. However, both bit and voltage diffusion layers are formed in the same major surface of the substrate; therefore, a degree of a high integration density is limited in some extent. Further, both bit and voltage diffusion layers extend in the same direction. Therefore, a conventional decoder circuit to select one bit cell can not be employed, and a new and complicated one is necessary.

SUMMARY OF THE INVENTION

Accordingly, it is an object of the invention to provide an integrated circuit semiconductor device which has an improved wiring structure to eliminate the problems caused by the contact structure and to enhance further the integration density.

According to one feature of the present invention, an integrated circuit semiconductor device has a semiconductor body of a first conductivity type having an upper surface. A plurality of first wiring diffusion layers of a second conductivity type which is opposite to the first conductivity type are formed in the semiconductor body. This formation is from the upper surface inwardly and extending in a first direction and in parallel with each other. An insulating film is formed on the upper surface of the semiconductor body including the first wiring diffusion layers. A plurality of contact holes are formed in the insulating film so as to reach surface parts of the first wiring diffusion layers.

A semiconductor layer is formed on the insulating film and is connected to the first wiring diffusion layers via the contact holes. A plurality of second wiring diffusion layers are formed in the semiconductor layer, extending in parallel with each other and in a second direction perpendicular to the first direction, and crossing over the first wiring diffusion layers by interposing the insulating film.

A plurality of element forming portions form impurity regions of semiconductor elements formed in the semiconductor layer. Each of the elements forming the portion is connected to a corresponding first wiring diffusion layer via the contact hole and to a corresponding second wiring diffusion layer. The second wiring diffusion layers may be of the second conductivity type.

The semiconductor layer may further include a plurality of first impurity regions of the second conductivity type, each region being formed in the corresponding element forming portion and being connected to the corresponding first wiring diffusion layer via the contact hole. A plurality of second impurity regions of the second conductivity type are formed in the corresponding element forming portion and are connected to the corresponding second wiring diffusion layer. A plurality of third impurity regions of the first conductivity type are formed in the corresponding element forming portion between the first and second impurity regions. Semiconductor elements are insulated gate type field effect transistors, each of the first impurity regions serves as either the source or drain regions of each of the transistors. Each of the second impurity regions serves as the other of the source or drain regions of each of the transistors. Each of the third impurity regions serves as a channel region of a transistor.

Further, when the transistors are memory elements, such as non volatile semiconductor memory elements, a plurality of word lines extend in parallel with each other and in the second direction so that each of the word lines is connected to corresponding gate electrodes such as control gate electrodes in the second direction. The first wiring diffusion layers in the semiconductor body serve as bit lines and the second wiring diffusion layers in the semiconductor layer serve as voltage lines. Moreover, a thick insulating layer pattern may be formed on the semiconductor body for delineating the semiconductor layer in which the second wiring diffusion layers and the element forming portions are formed.

According to another feature of the present invention, a non volatile semiconductor memory device has a memory cell array section which is provided in a semiconductor chip and includes a plurality of non volatile semiconductor memory elements arranged in a matrix form. The memory cell array section has a semiconductor body of a first conductivity type (for example, a P-type) having an upper surface. A plurality of bit lines are formed by an impurity diffusion of a second conductivity type (for example, a N-type) which is opposite to the first conductivity type, these lines being formed in the semiconductor body from the upper surface inwardly to extend in a first direction and in parallel with each other. A insulating film is formed on the upper surface of the semiconductor body including the bit lines. A plurality of contact holes are formed in the first insulating film so as to reach to predetermined surface parts of the bit lines.

A semiconductor layer having a plan shape (for example, a grid-like plan shape) is formed on the first insulating film and is connected to the bit lines through the contact holes. A second insulating film is thicker than the first insulating film and is formed on the semiconductor body to delineate the semiconductor layer. A plurality of voltage lines have the second conductivity type, and are formed in the semiconductor layer. The voltage lines extend in parallel with each other and in a second direction which is perpendicular to the first direction, and cross over the bit lines by way of an interpassing first insulating film. A plurality of first impurity regions of the second conductivity type are formed in the semiconductor layer and are connected to the bit lines by way of the contact holes. Each of the first impurity regions is employed as either a source of drain region of each of the non volatile semiconductor memory elements.

A plurality of second impurity regions of the second conductivity type are formed in the semiconductor layer, and are connected to the voltage lines. Each of the second impurity regions is employed as the other of the source or drain regions of each of the non volatile semiconductor memory elements. A plurality of third impurity regions of the first conductivity type are formed in the semiconductor layer between the first and second impurity regions. Each of the third impurity regions is employed as a channel region of each of the non volatile semiconductor memory elements. A plurality of first gate insulating films are formed on the respective third impurity regions. A plurality of floating gate electrodes are on the respective first gate insulating films. A plurality of second gate insulating films are formed on the respective floating gate electrodes. A plurality of control gate electrodes are formed on the respective second gate insulating films. A plurality of word lines extend in parallel with each other and connect the control gate electrodes in the second direction.

The second impurity regions may be continuously formed with the voltage lines. The control gate electrodes may be continuously formed with the word lines so that portions of the word lines on the second gate insulating films constitute the control gate electrodes. Generally, the semiconductor body and the semiconductor layer are made of monocrystalline silicon. The floating gate electrodes and the word lines including the control gate electrodes are made of polycrystalline silicon. The semiconductor layer may be a monocrystalline silicon layer formed by a selective epitaxial growth method by using the surface parts of the bit lines exposed in the contact holes as seeds. Or else, the semiconductor silicon layer may be a monocrystalline silicon layer converted from amorphous silicon or polycrystalline silicon. The second insulating film may be a silicon oxide layer converted from a silicon layer by a selective oxidation method.

According to the present invention, the first wiring layers which are used as bit lines are buried in the substrate. Therefore, it is necessary to form contact openings insulating layer for connecting a bit line to a drain (or source) region. Further, the first and second diffusion wiring layers are formed in different surface levels, crossing over each other with an interposing insulating film. Therefore, a higher integration density can be obtained.

DESCRIPTION OF THE PRIOR ART

Figure 1A:
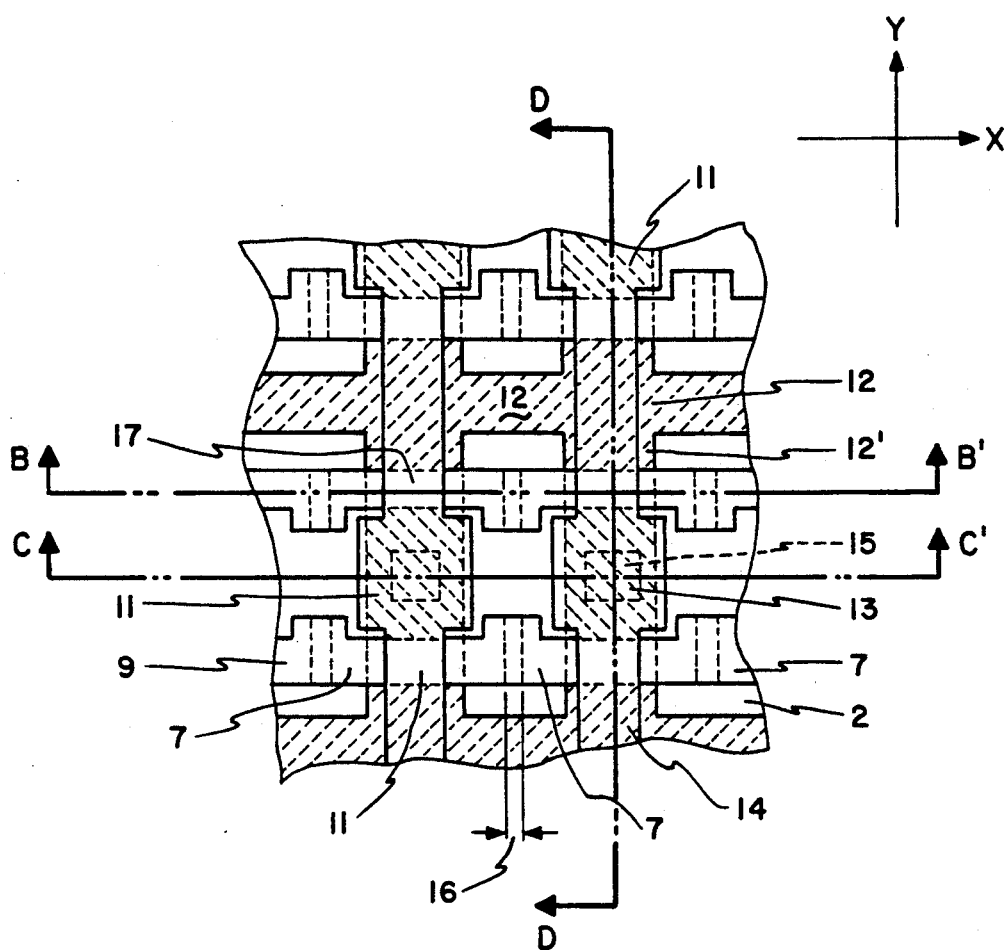
FIG. 1A is a plan view showing a conventional memory device.
Figure 1B:
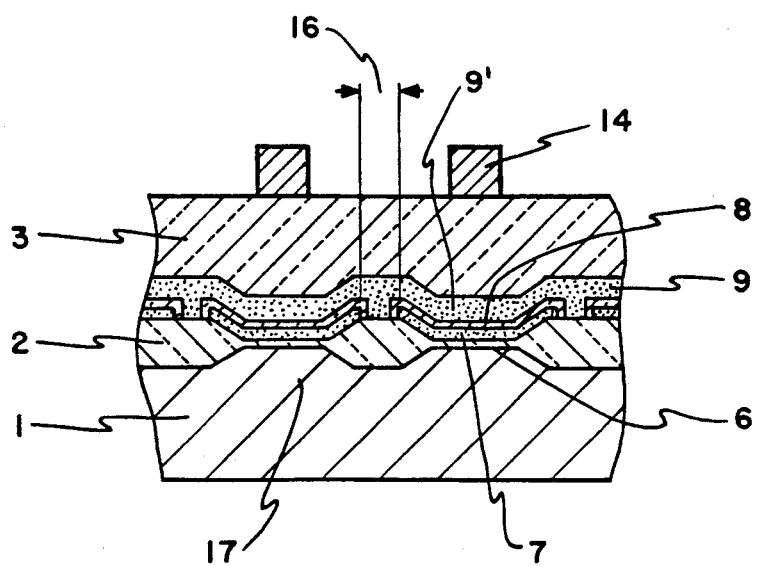
FIGS. 1B, 1C and 1D are cross-sectional views taken along lines B—B', C—C' and D—D' in FIG. 1A as viewed in the direction of the arrows, respectively.
Figure 1C:
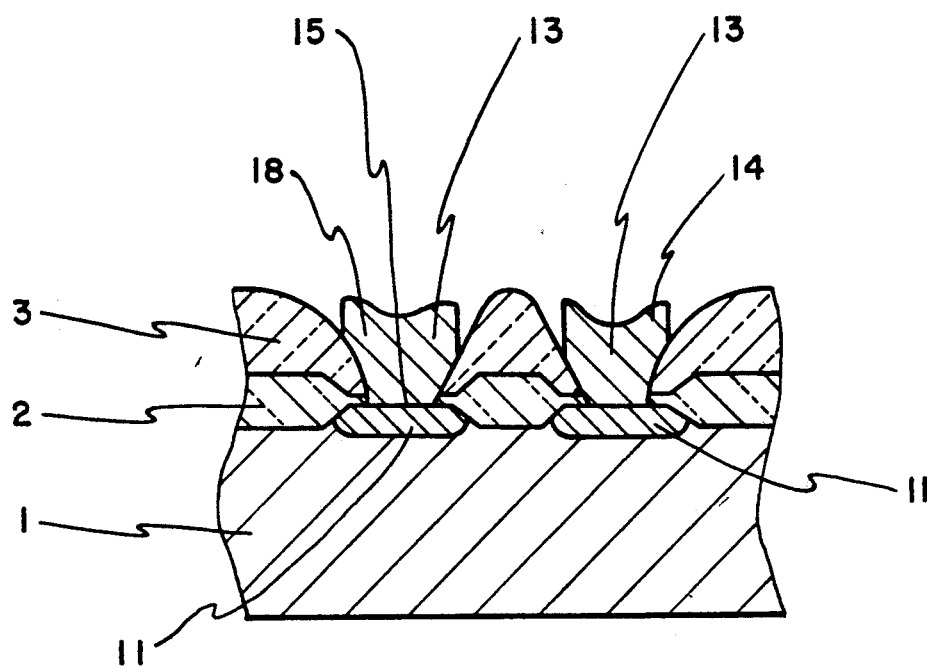
Figure 1D:
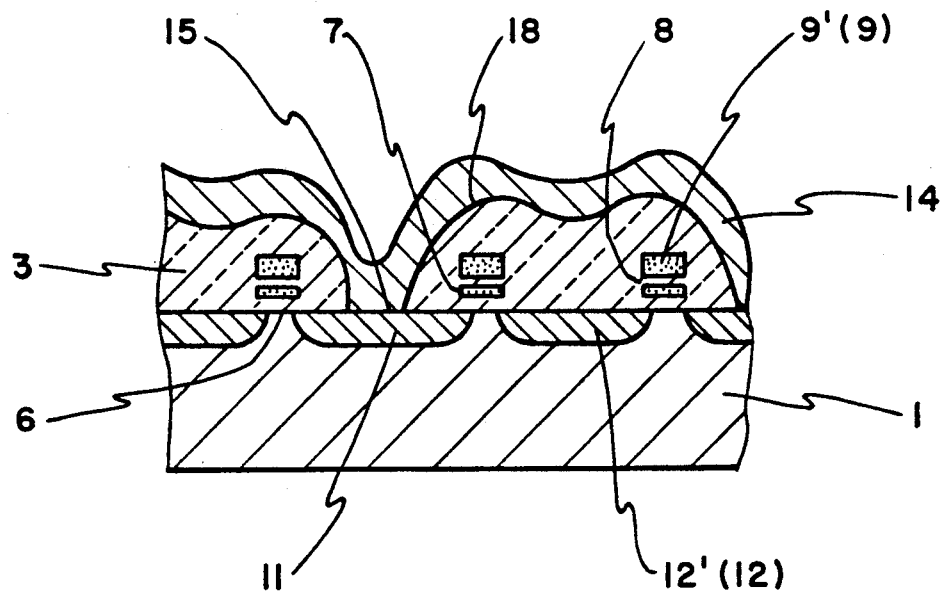

Referring to FIGS. 1A to 1D, a conventional non volatile semiconductor memory device will be explained. N-type drain diffusion regions 11 of island-like plan shape (represented by left-upward dot hatching in FIG. 1A) and N-type voltage lines 12 including N-type source diffusion regions 12' (represented by right-upward dotted-line cross hatching in FIG. 1A) are formed in a P-type silicon substrate 1 from the major surface. Channel regions 17 are positioned between the source regions 12' and the drain regions 11. These regions 11, 17 and the lines 12 including the region 12' are delineated by thick field silicon oxide films 2. A first gate insulating film 6, a floating gate electrode 7, a second gate insulating film 8 and a control gate electrode 9' are formed in sequence on every channel region 17.

The N-type voltage lines 12 extend in an X-direction (FIG. 1A) and in parallel with each other. Word lines 9 also extend in X-direction (FIG. 1A), in parallel with each other. The word lines connect to and are continuously formed with the control gate electrodes 9'. The floating gate electrodes 7 are separated from each other by a gap 16. Electrodes 7 have plan shape as and are positioned just under the control gate electrodes 9'. An inter-ply insulating layer 3 is entirely formed, and then contact openings 13 are formed with an abrupt taper 18 in the insulating layer 3 to expose surface parts 15 of the drain regions 11. Aluminum bit lines 14 extend in the Y-direction (FIG. 1A) on the inter-ply insulating layer 3 and connect to respective drain regions 11 at the exposed surface parts 15, the connections being made through the contact openings 13.

DETAILED DESCRIPTION OF THE EMBODIMENTS

Figure 2:
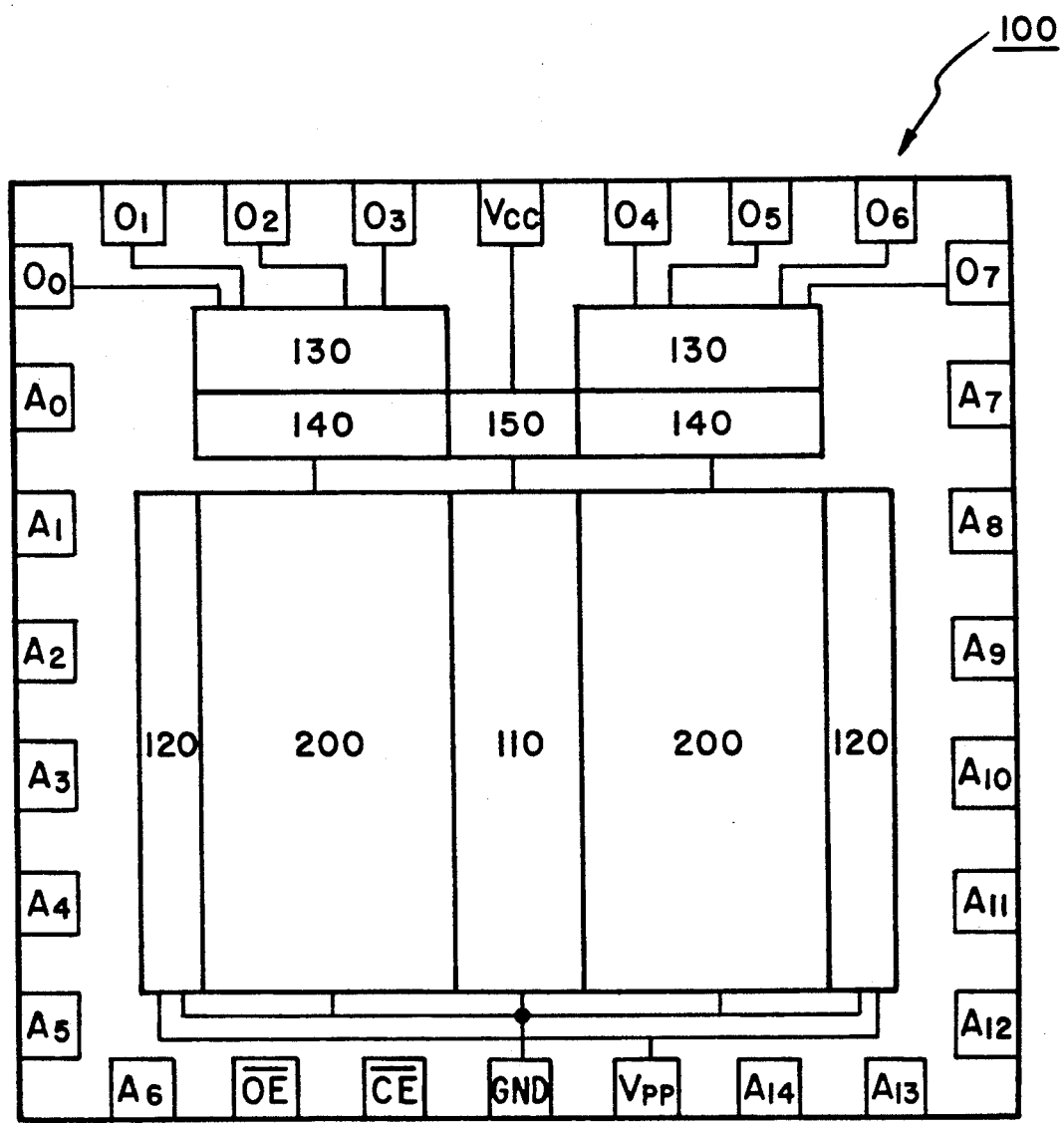
FIG. 2 is a plan view schematically showing a semiconductor memory device to which embodiments of the present invention are adaptable.

Referring to FIG. 2, a semiconductor chip (semiconductor memory device) 100 of the present embodiments comprises eight output terminals ($O_0$ to $O_7$), fifteen address terminals ($A_0$ to $A_{14}$), a ground terminal (GND), voltage power supply terminals (Vcc, Vpp), a chip enable terminal ($\overline{CE}$), an output enable terminal ($\overline{OE}$), X-decoder sections 110, 120, sense amplifier sections 130, Y-selector sections 140, a Y-decoder section 150 and memory cell array sections 200. The inventive embodiments are in the memory cell array section 200.

First Embodiment

Referring to FIGS. 3A to 3D, a plurality of first diffusion wiring layers 23 of N-type are used as bit lines and are formed in a P-type monocrystalline silicon body 21 from the upper surface 29. These bit lines extend in a Y-direction (FIG. 3A) and in parallel with each other. On the upper surface 29 of the silicon body 21 including the first wiring layers 23, a first silicon oxide film 22 is entirely formed. A plurality of contact holes or seed holes 24 are formed in the first silicon oxide film 22 to expose surface parts of the N-type bit lines 23.

A monocrystalline silicon layer 31 of a grid-like plan shape is formed on the first silicon oxide film 22 and connected to the N-type bit lines 23 via the contact holes 24. The silicon layer 31 is delineated by second silicon oxide films 27 of a rectangular plan shape and having a thickness which is thicker than the thickness of the first silicon oxide film 22. A plurality of second diffusion wiring layers 26 (represented by right-upward dotted-line cross hatching in FIG. 3A) of N-type are used as voltage lines which supply ground voltage (earth potential) or maintain a floating state. These voltage lines extend in an X-direction (FIG. 3A), perpendicular to a Y-direction, and in parallel with each other. These lines are formed in a grid-like pattern in the silicon layer 31 such that they cross over the N-type bit lines 23 of the first diffusion wiring layers by interposing the first silicon oxide films 22 at crossing portions 32.

Further, the silicon layer 31 includes a plurality of N-type source (or drain) regions 26' (represented by right-upward dashed line hatching in FIG. 3A) continuously formed with the voltage lines 26. A plurality of N-type drain (or source) regions 25 (represented by left-upward dot hatching in FIG. 3A) are connected to the N-type bit lines 23 by way of the contact holes 24, respectively. A plurality of P-type channel regions 28 are positioned between pairs of the source and drain regions 26', 25, respectively.

On every channel region 28 is formed a first gate insulating film 6 of silicon oxide, a floating gate electrode 7 of lower level polycrystalline silicon, a second gate insulating film 8 of silicon oxide and a control gate electrode 9' of upper level polycrystalline silicon. These layers are formed in sequence to form every non volatile semiconductor memory element. Further, silicon oxide films 6' are continuously formed with the first gate insulating films 6 and on the source and drain regions.

A plurality of word lines 9 of the upper polycrystalline silicon extend in an X-direction (FIG. 3A), an in parallel with each other. Each of the word lines 9 connects to and is continuously formed with the control gate electrodes 9' in the X-direction. The floating gate electrodes 7 are separated from each other by a gap 16 and have the same plan shape as and are positioned just under the control gate electrodes 9'. A passivation layer 30 is entirely formed. The whole portions of the silicon layer 31 have a grid-like plan shape and are not necessarily monocrystalline. For example, the portions in which the second N-type diffusion wiring layers 26 of the voltage lines are formed may be made of polycrystalline.

Next, the process steps for manufacturing the first embodiment will be explained by referring to FIGS. 4 to 9.

Figure 4:
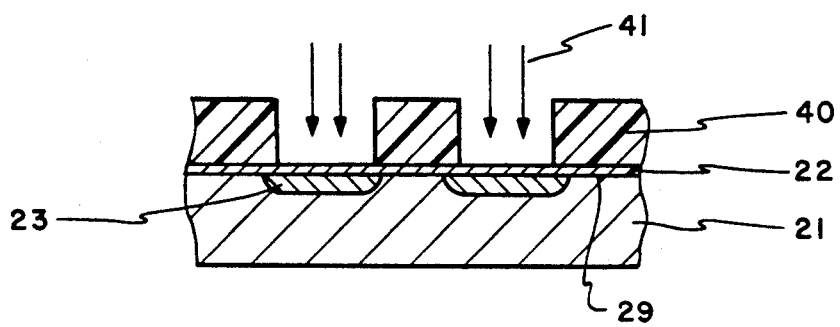
FIGS. 4 to 8 are cross-sectional views showing process steps in sequence for manufacturing the first embodiment.

On the upper surface 29 of the P-type silicon body 21 having a specific resistivity $\rho$ of 10 to 15 $\Omega \cdot cm$, the first silicon oxide film 22 is thermally formed. The first diffusion wiring layers 23 which are used as the bit lines are formed through a use of an arsenic ion implantation 41 of 70 KeV, $5.0 \times 10^{15}$ cm$^{-2}$ dosage by using a photo resist pattern 40 as a mask (FIG. 4). After removing the photo resist pattern 40, an annealing neat treatment for activation of implanted ions is conducted.

Figure 5:
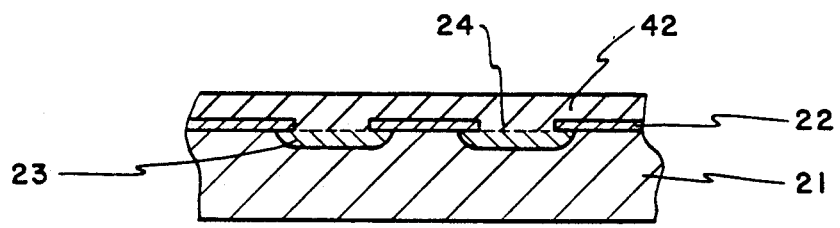

Next, contact holes 24 are formed in the film 22 in order to exposed surface parts of the N-type layers 23. A P-type polycrystalline or amorphous silicon layer is entirely deposited on the silicon oxide film 22 and within the contact holes 24 through a use of an LPCVD (Low Pressure Chemical Vapour Deposition) method using a gas which is a mixture of $SiH_4$ and $B_2H_6$ at 550° C. Then, the silicon layer is converted to a p$^-$-type monocrystalline silicon layer 42 having a boron concentration of $5.0 \times 10^{16}$ cm$^{-3}$ through a long annealing heat treatment at 1000° C. during 10 hours using the contact holes 24, that is, the exposed surface parts in the holes as seeds (FIG. 5).

Figure 6:
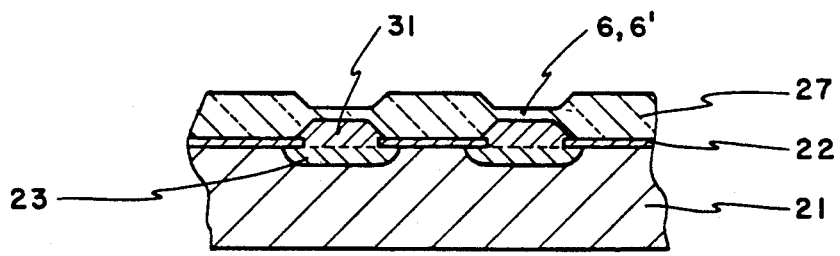

Next, a selective oxidation is conducted to the monocrystalline silicon layer 42 in order to form the silicon layer 31 of a grid-like plan shape and to form the thick second silicon oxide film 27 from the silicon layer 42 by using a silicon nitride film pattern (not shown) as the mask. Then, after removing the silicon nitride film pattern, the silicon oxide films 6,6' are continuously, thermally formed. Films 6,6' include the first gate insulating films (FIG. 6).

Figure 7:
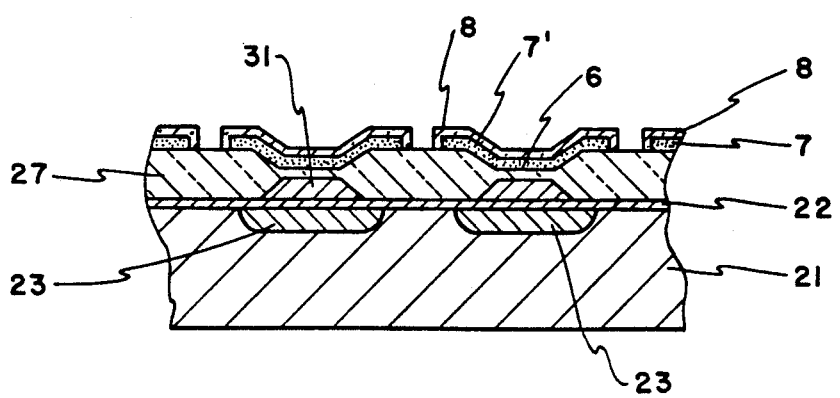
Figure 8:
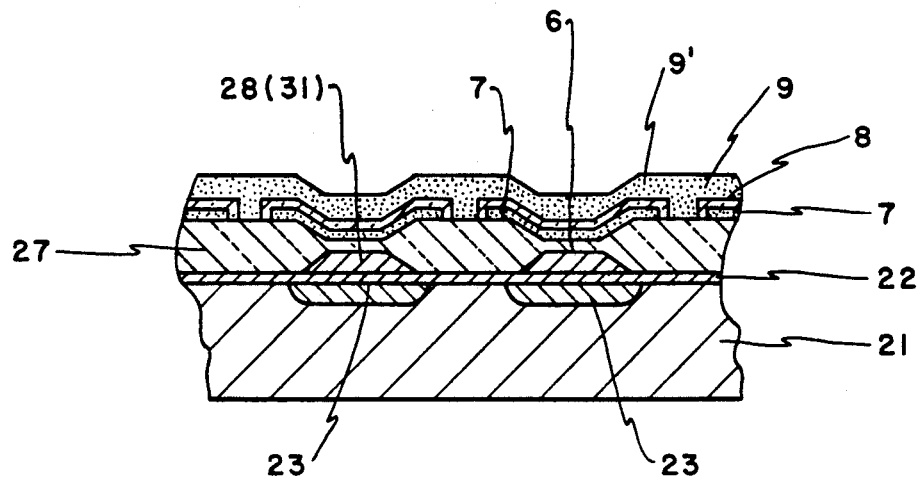

Then, in a conventional manner, the process steps shown in FIGS. 7 and 8 are conducted. That is, doped polycrystalline silicon stripes 7' which have the same length as the floating gate electrodes in the X-direction (FIG. 3A) but which extend continuously in Y-direction (FIG. 3A) are formed. Then the second silicon oxide gate films 8 are thermally grown (FIG. 7).

Next, the word lines 9 including control gate electrodes 9' are formed from doped polycrystalline silicon by using a photo-resist mask pattern (not shown). By the same mask pattern, portions of the doped polycrystalline silicon stripes 7' and the films 8 protruding from the mask pattern in the Y-direction (FIG. 3A) are etched away to form the floating gate electrodes 7.

Figure 3A:
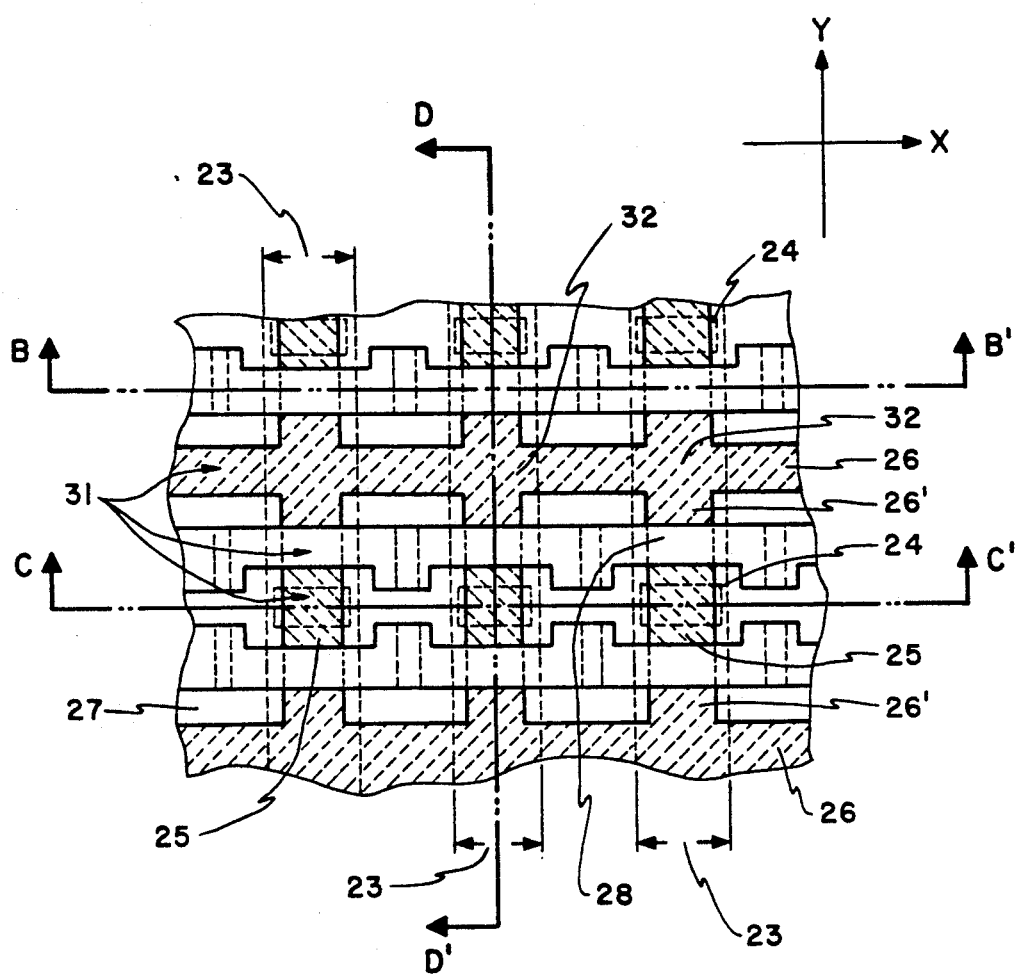
FIG. 3A is a plan view showing a first embodiment of the present invention.
Figure 3B:
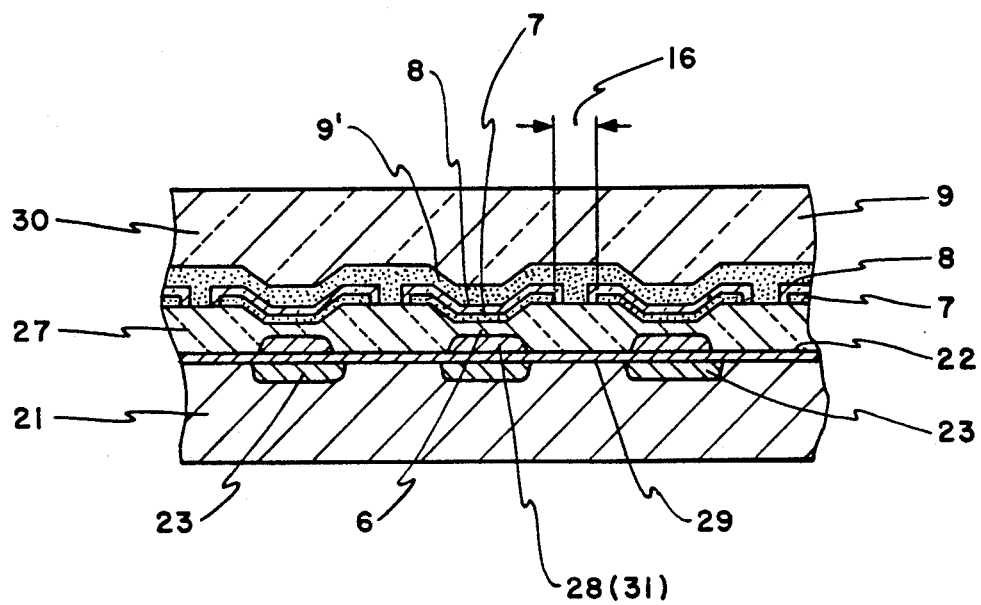
FIGS. 3B, 3C and 3D are cross-sectional views taken along lines B—B', C—C' and D—D' in FIG. 3A as viewed in the direction of arrows, respectively.
Figure 3C:
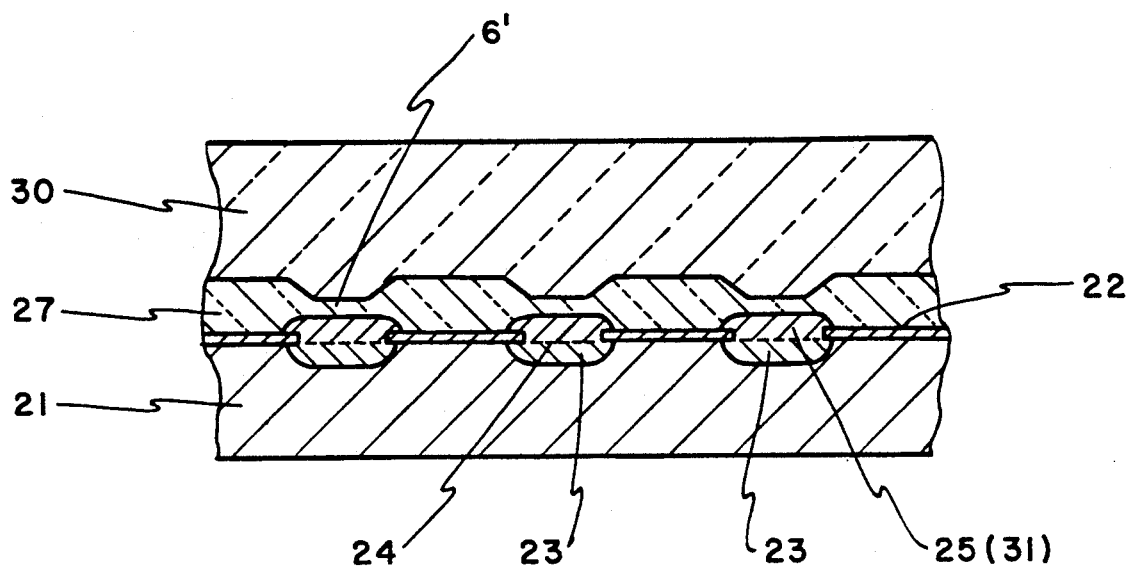
Figure 3D:
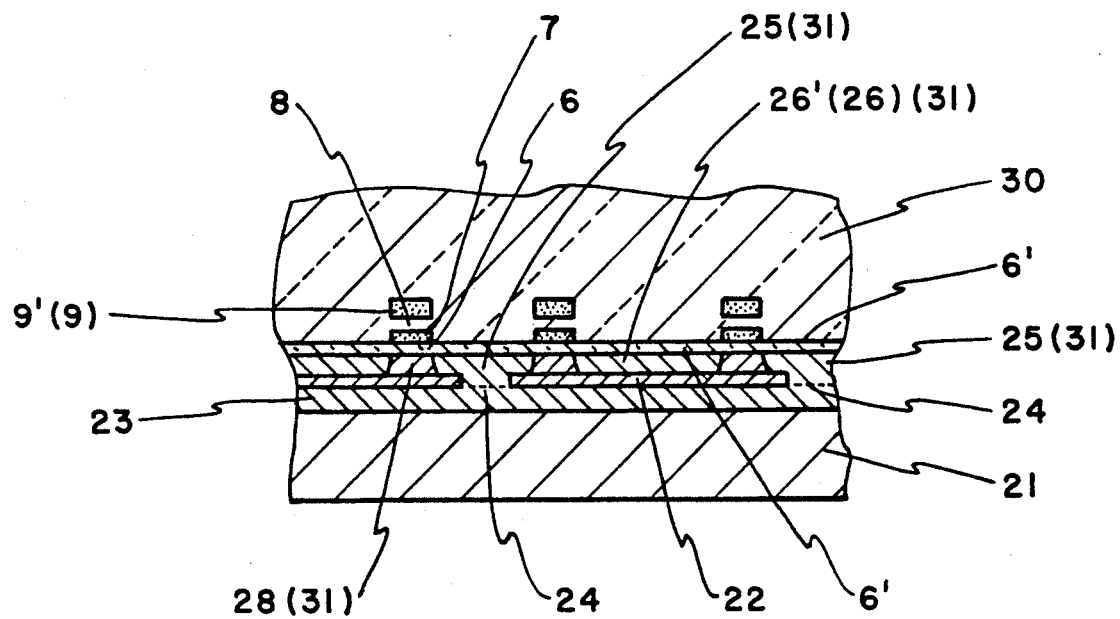

Next, arsenic or phosphorus ion implantation, followed by activation annealing, is carried out using the thick second silicon oxide films and the control gate electrodes as a mask to form the N-type source and drain regions 26' 25 and the N-type voltage lines 26 (FIG. 3) in the silicon layer 31, and to define the P-type channel regions 28 (FIG. 8). By the process steps, the N-type drain regions 25 are formed so that they are connected to respective N-type bit lines 23 as shown in FIGS. 3C and 3D. FIGS. 4 to 6 show a section corresponding to FIG. 3C, and FIGS. 7 and 8 show a section corresponding to FIG. 3B.

Figure 9:
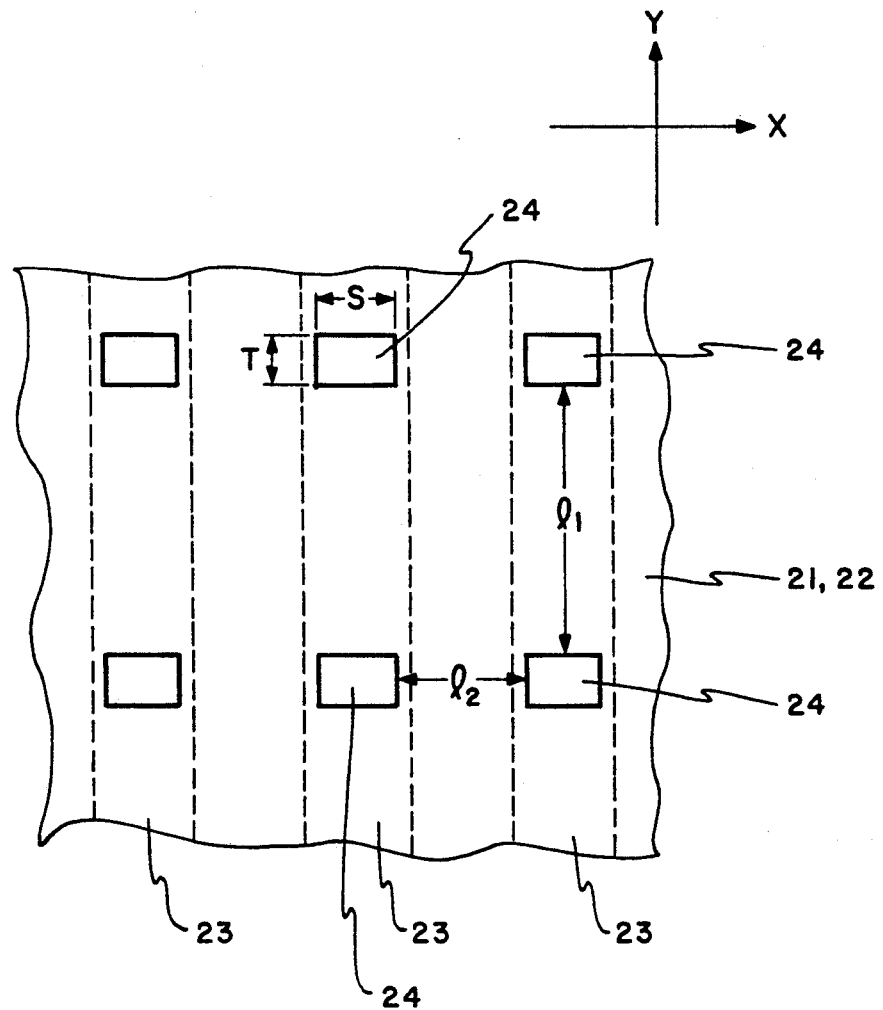
FIG. 9 is a plan view showing diffusion wirings and seed holes of the first embodiment.
Figure 10A:
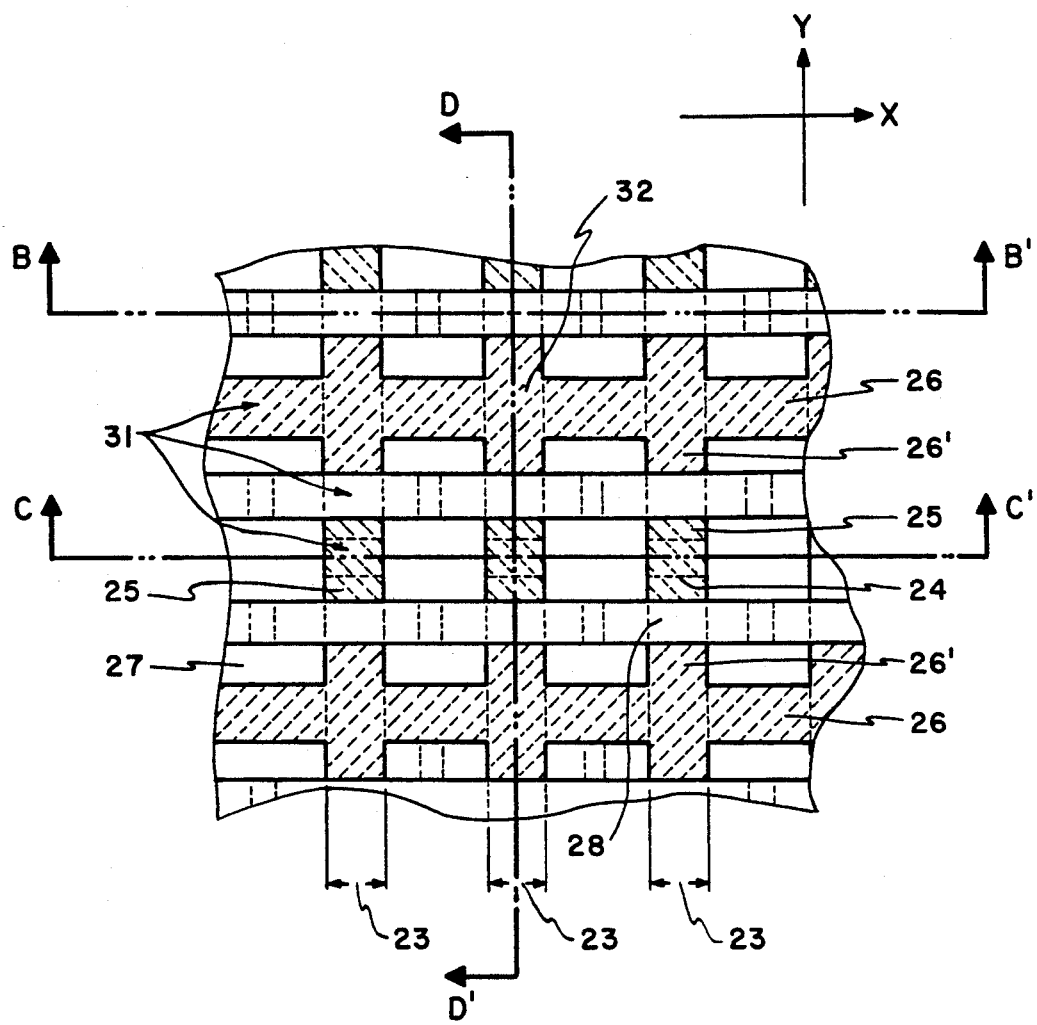
FIG. 10A is a plan view showing a second embodiment of the present invention.
Figure 10B:
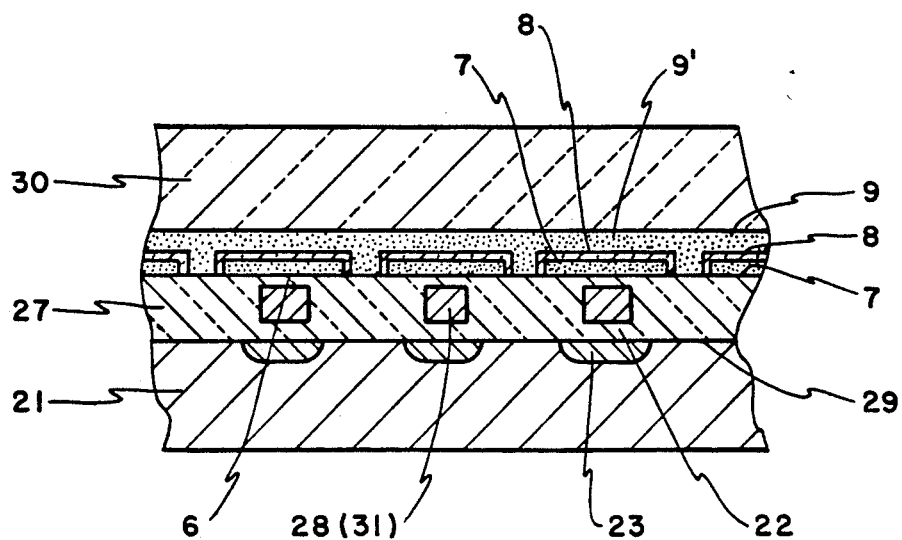
FIGS. 10B, 10C and 10D are cross-sectional views taken along lines B—B', C—C' and D—D' in FIG. 10A as viewed in the direction of arrows, respectively.
Figure 10C:
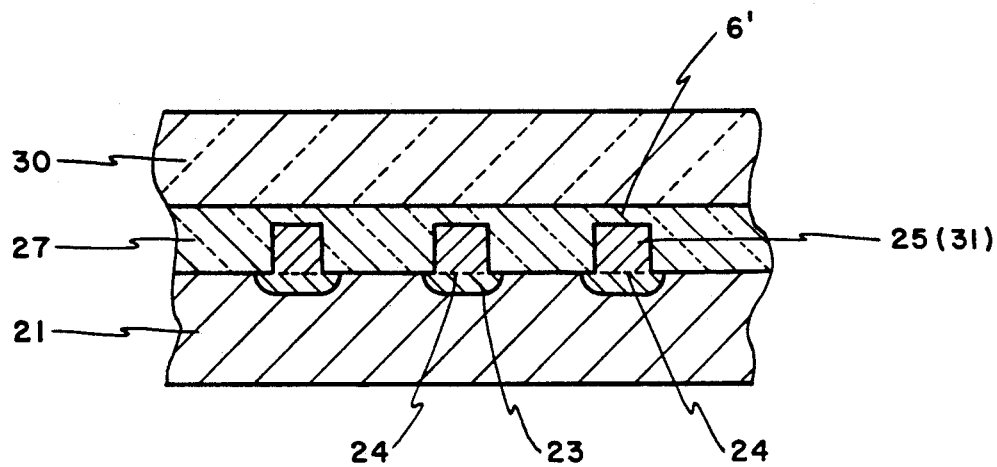
Figure 10D:
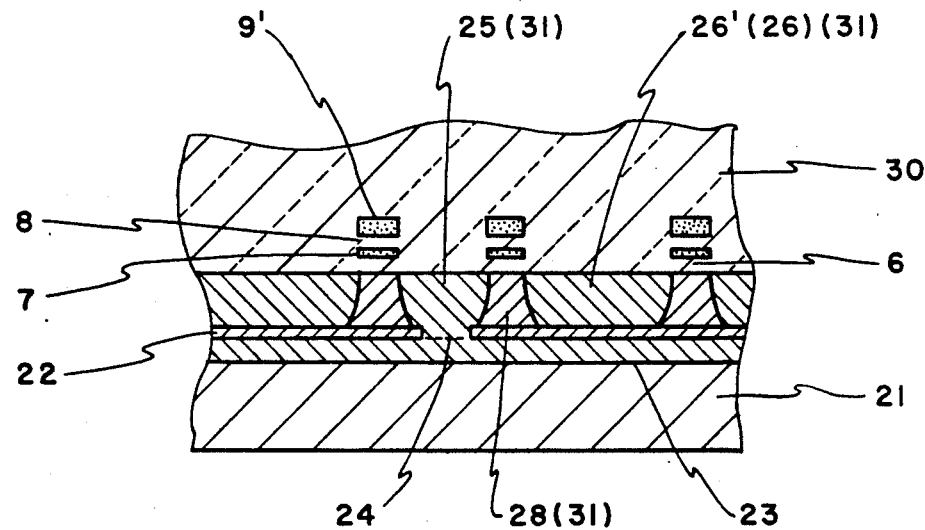

The dimensions of the seed holes (contact holes) 24 and the distribution thereof are exemplified in FIG. 9 in which the seed hole 24 has the dimensions of 2.4 $\mu m \times 1.2$ $\mu m$ (S×T) and keeps the intervals relative to each other of 4.5 $\mu m$ ($l_1$) and 3.0 $\mu m$ ($l_2$).

Second Embodiment

FIGS. 10A to 10D show the second embodiment. The same components that are also shown in FIGS. 3A to 3D are indicated by the same reference numerals.

In the second embodiment, however, the thin first silicon oxide film 22 is provided only under the grid-like semiconductor layer 31. The second oxide films 27 is used as a field insulating layer which is direct contact with upper surface 29 of the P-type silicon body 21.

Referring to FIGS. 11 to 14, the process steps for manufacturing the second embodiment will be explained.

The thick silicon oxide film 27 is formed on the upper surface 29 of the P-type monocrystalline silicon body 21. Then an opening 51 having a grid-like plan shape is formed in the film 27. Next, the thin silicon oxide film 22 is thermally formed on the exposed surface 29 of the silicon body 21 within the opening 51.

Figure 11:
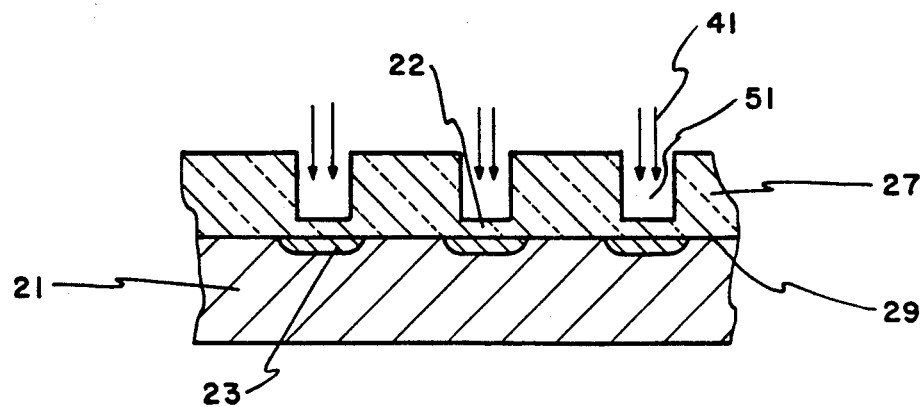
FIGS. 11 to 14 are cross-sectional views showing process steps in sequence for manufacturing the second embodiment.
Figure 12:
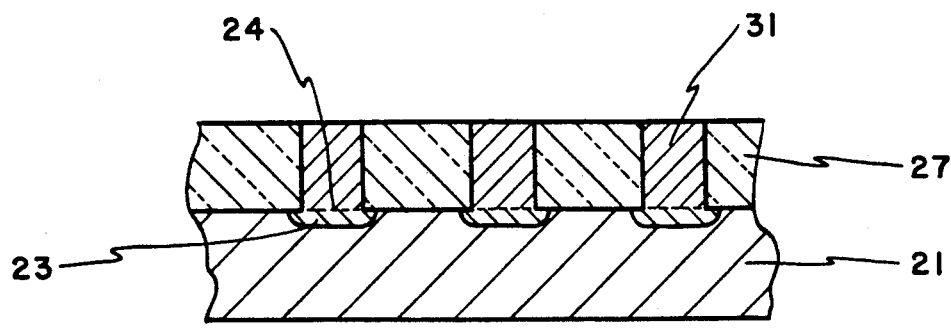
Figure 13:
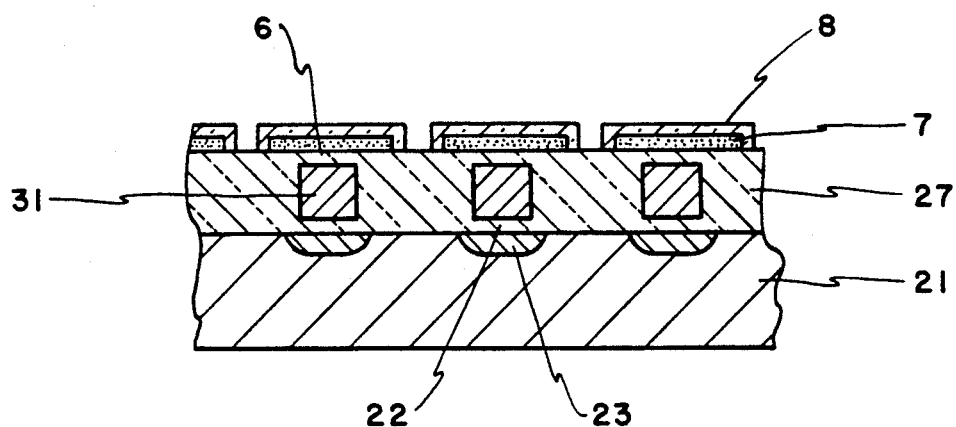
Figure 14:
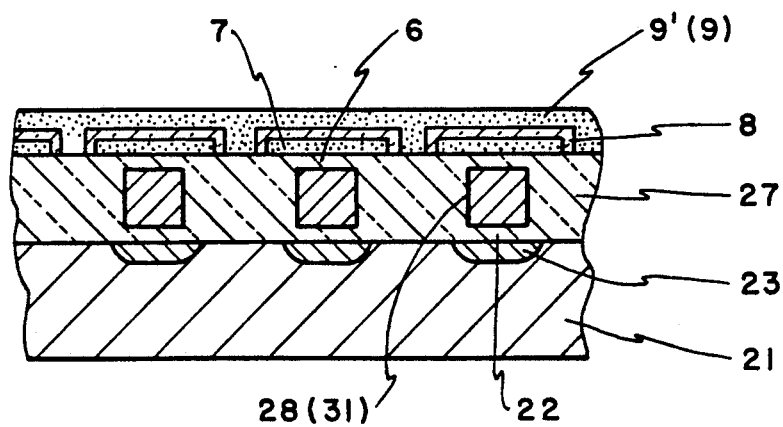

A mask pattern (not shown) is selectively formed in the grid-like opening 51. Then an arsenic ion implantation 41 followed by an activation process is carried out to form the first N-type diffusion wiring layers 23 used as the bit lines (FIG. 11). Next, the seed holes (contact holes) 24 are formed in the thin silicon oxide film 22. Then, the P⁻-type monocrystalline silicon layer 31 having a grid-like plan shape and a impurity concentration of $5.0 \times 10^{16}$ cm⁻³ is formed within the opening 51 by filling the opening 51 with P-type monocrystalline silicon through a selective epitaxial method which is conducted by flowing a gas mixture of SiH₂Cl₂, H₂, HCl and B₂H₆ under a low pressure of 80 T$_{orr}$ at 950° C. Then, the process steps shown in FIGS. 13 and 14, which are the same as in FIGS. 7 and 8 of the first embodiment, are conducted to complete the second embodiment.

According to the second embodiment, the first and second diffusion wiring layers 23, 26, the seed holes (contact holes) 24, and source, drain and channel regions 26', 25, 28 are all formed in a self-aligned manner. Therefore, no margin is required for alignment and the cell area can be reduced.

What is claimed is:

1. An integrated circuit semiconductor device comprising:
   a semiconductor body of a first conductivity type having an upper surface;
   a plurality of first wiring diffusions regions of a second conductivity type which is opposite to said first conductivity type formed in said semiconductor body from said upper surface inwardly and extending in a first direction and in parallel with each other;
   an insulating film formed on said upper surface of said semiconductor body including said first wiring diffusion regions;
   a plurality of contact holes formed in said insulating film so as to reach to surface parts of said first wiring diffusion regions;
   a semiconductor layer formed on said insulating film and connected to said first wiring diffusion regions via said contact holes;
   a plurality of second wiring diffusion regions formed in said semiconductor layer, extending in parallel with each other and in a second direction perpendicular to said first direction, and crossing over said first wiring diffusion regions by interposing said insulating film; and
   a plurality of element forming portions for forming impurity regions of semiconductor elements formed in said semiconductor layer, each of said element forming portions being connected to a corresponding one of said first wiring diffusion regions and to a corresponding one of said second wiring diffusion regions.

2. An integrated circuit semiconductor device of claim 1, in which said second wiring diffusion regions in said semiconductor layer are of said second conductivity type, and said semiconductor layer further includes a plurality of first impurity regions of said second conductivity type each formed in a corresponding one of said element forming portions and connected to a corresponding one of said first wiring diffusion regions via one of said contact holes, a plurality of second impurity regions of said second conductivity type each formed in a corresponding one of said element forming portions and connected to a corresponding one of said second wiring diffusion regions, and a plurality of third impurity regions of said first conductivity each formed in a corresponding one of said element forming portions between said first and second impurity regions.

3. An integrated circuit semiconductor device of claim 2, in which said semiconductor elements are memory elements using insulated gate type field effect transistors, and said first wiring diffusion regions are employed as bit lines and said second wiring diffusion regions are employed as voltage lines.

4. An integrated circuit semiconductor device of claim 3, in which each of said first impurity regions serves as either a source or a drain region of each of said insulated gate type field effect transistors; each of said second impurity regions serves as either a source or a drain region of each of said insulated gate type field effect transistors; and each of said third impurity regions serves as a channel region of each of said insulated gate type field effect transistors.

5. An integrated circuit semiconductor device of claim 4 further comprising a plurality of first gate insulating films formed on respective said channel regions, a plurality of floating gate electrodes formed on respective said first gate insulating films, a plurality of second gate insulating films formed on respective said floating gate electrodes, and a plurality of control gate electrodes, formed on respective said second gate insulating films, and in which said insulated gate type field effect transistors are non volatile semiconductor memory elements.

6. An integrated circuit semiconductor device of claim 5 further comprising a plurality of word lines extending in parallel with each other and in said second direction, each of said word lines being connected to corresponding said control gate electrodes.

7. An integrated circuit semiconductor device of claim 1 further comprising a thick insulating layer pattern formed on said semiconductor body and having a plurality of rectangular patterns arranged in a matrix form so that said semiconductor layer between said rectangular patterns has a grid-like plan shape.

8. A non volatile semiconductor memory device having a memory cell array section which is provided in a semiconductor chip and includes a plurality of non volatile semiconductor memory elements arranged in a matrix form;

said memory cell array section comprising;

a semiconductor body of a first conductivity type having an upper surface;

a plurality of impurity diffusion regions serving as bit lines having a second conductivity type opposite to said first conductivity type, formed in said semiconductor body from said upper surface inwardly, and extending in a first direction and in parallel with each other;

a first insulating film formed on said upper surface of said semiconductor body including said bit lines;

a plurality of contact holes formed in said first insulating film so as to reach to predetermined surface of said bit lines;

a semiconductor layer formed on said first insulating film and connecting to said surface parts of said bit lines through said contact holes;

a second insulating film formed on said first insulating film, the second insulating film having a plurality of rectangular patterns arranged in a matrix form so that said semiconductor layer between said rectangular patterns has a grid-like plan shape;

a plurality of voltage lines having said second conductivity type, formed in said semiconductor layer, extending in parallel with each other and in a second direction perpendicular to said first direction and crossing over said bit lines by interposing said first insulating film;

a plurality of first impurity regions of said second conductivity type formed in said semiconductor layer and connected to said bit lines through said contact holes, each of said first impurity regions being employed as either a source or a drain region of each of said non volatile semiconductor memory elements;

a plurality of second impurity regions of said second conductivity type formed in said semiconductor layer, and connected to said voltage lines, each of said second impurity regions being employed as either a source or a drain region of each of said non volatile semiconductor memory elements;

a plurality of third impurity regions of said first conductivity type formed in said semiconductor layer between said first and second impurity regions, each of said third impurity regions being employed as a channel region of each of said non volatile semiconductor memory elements;

a plurality of first gate insulating films formed on said third impurity regions, respectively;

a plurality of floating gate electrodes formed on said first gate insulating films, respectively;

a plurality of second gate insulating films formed on said floating gate electrodes, respectively;

a plurality of control gate electrodes formed on said second gate insulating films, respectively; and a plurality of word lines extending in parallel with each other and in said second direction and connecting said control gate electrodes in said second direction.

9. A non volatile semiconductor memory device of claim 8, in which said first conductivity type is P-type, and said second conductivity type is N-type.

10. A non volatile semiconductor memory device of claim 8, in which said second insulating film is thicker than said first insulating film.

11. A non volatile semiconductor memory device of claim 8, in which said semiconductor body and said semiconductor layer are made of monocrystalline silicon, and said floating gate electrodes and said word lines including said control gate electrodes are made of polycrystalline silicon.

12. A non volatile semiconductor memory device of claim 8, in which said semiconductor layer is a monocrystalline silicon layer formed by a selective epitaxial growth method using said surface parts of said impurity diffusion regions serving as bit lines exposed in said contact holes as seeds.

13. A non volatile semiconductor memory device of claim 8, in which said semiconductor silicon layer is a mono-crystalline silicon layer converted from amorphous silicon or polycrystalline silicon, and said second insulating film is a silicon oxide layer converted from a silicon layer by a selective oxidation method.

14. A non volatile semiconductor memory device of claim 8, in which said voltage lines and said second impurity regions are continuously formed in said semiconductor layer.

15. A non volatile semiconductor memory device of claim 8, in which said word lines and control gate electrodes are continuously formed such that portions of said word lines on said second gate insulating films constitute said control gate electrodes.

* * * * *